United States Patent [19]
Choi

[11] Patent Number: 5,650,347
[45] Date of Patent: Jul. 22, 1997

[54] METHOD OF MANUFACTURING A LIGHTLY DOPED DRAIN MOS TRANSISTOR

[75] Inventor: Yong-Kyoo Choi, Seoul, Rep. of Korea

[73] Assignee: LG Semicon Co., Ltd., Chungcheongbuk-do, Rep. of Korea

[21] Appl. No.: 507,557

[22] Filed: Jul. 26, 1995

[51] Int. Cl.$^6$ .............. H01L 21/265; H01L 21/225; H01L 21/385; H01R 21/22
[52] U.S. Cl. .............. 437/44; 437/151; 437/164
[58] Field of Search .............. 437/29, 44, 141, 437/150, 151, 160, 161, 163, 164; 148/DIG. 151

[56] References Cited

U.S. PATENT DOCUMENTS

| | | | |
|---|---|---|---|
| 4,588,455 | 5/1986 | Genser | 437/168 |
| 4,597,824 | 7/1986 | Shinada et al. | 437/164 |
| 4,994,404 | 2/1991 | Sheng et al. | 437/44 |
| 5,086,005 | 2/1992 | Hirakawa | 437/162 |
| 5,183,777 | 2/1993 | Doki et al. | 437/160 |
| 5,297,956 | 3/1994 | Yamabe et al. | 432/2 |

OTHER PUBLICATIONS

"Potential Profile Engineering for Quarter Micron Buried Channel pMOSFETs with n Regions in the Channel" K. Okabe, T. Ikezawa, I. Sakai and M. Fukuma.

*Primary Examiner*—John Niebling
*Assistant Examiner*—Brian K. Dutton
*Attorney, Agent, or Firm*—Birch, Stewart, Kolasch & Birch, LLP

[57] ABSTRACT

A method of manufacturing a lightly doped drain MOS transistor having the double shallow junction is disclosed including the steps of forming a gate and a gate insulating film on a semiconductor substrate of a first conductivity type, sequentially; forming, on the top and sidewalls of the gate, on side edges of the gate insulating layer, and on the substrate, an insulating film including two kinds of impurities whose diffusivity and conductivity type are different from each other forming a cap insulating film on the insulating film; performing the heat treatment process thereby to form impurity regions of a second conductivity type and impurity regions of the first conductivity type surrounding the impurity regions of the second conductivity type, on both sides of the gate in the substrate; etching the insulating film and the cap insulating film thereby to form sidewall spacers on both sides of the gate; and ion-implanting an impurity of the second conductivity type in the substrate thereby to form impurity regions of the second conductivity type adjacent to the impurity regions.

20 Claims, 5 Drawing Sheets

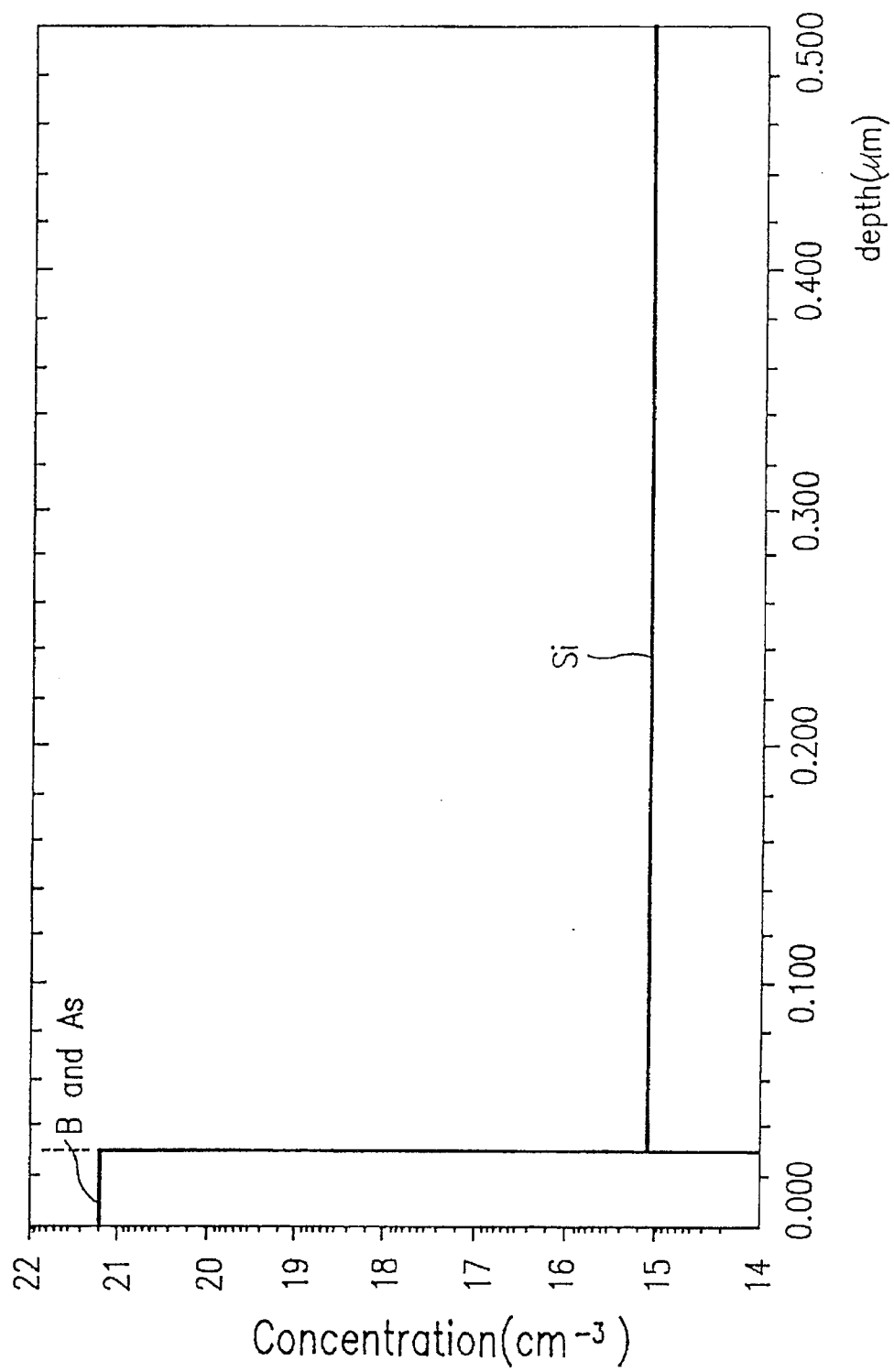

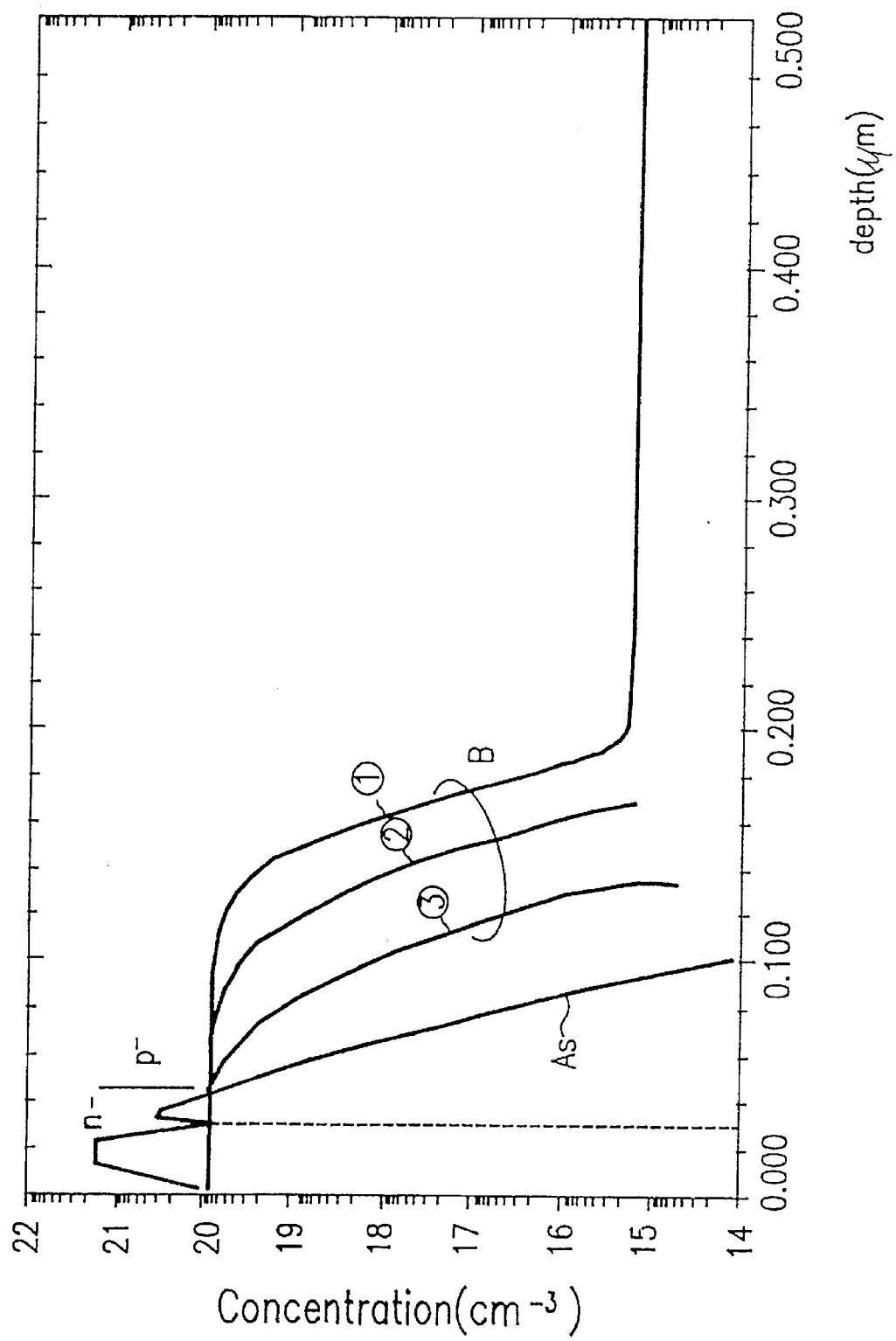

5,650,347

1

METHOD OF MANUFACTURING A LIGHTLY DOPED DRAIN MOS TRANSISTOR

BACKGROUND OF THE INVENTION

The present invention relates to a metal oxide semiconductor (MOS) transistor, and more particularly, to a method of manufacturing a MOS transistor having a pocket structure which prevents substrate defects, due to ion-implantation, by forming a double shallow junction using an insulating film containing impurities.

As the integration of devices increases, short channel effects such as the punchthrough and drain induced barrier lowering (DIBL), are generated. In order to prevent the short channel effects, there was suggested a lightly doped drain (LDD) MOS transistor having an $n^-$ or $p^-$ type pocket region adjacent to source/drain regions of low concentration.

FIGS. 1A to 1D are cross-sectional views for showing a conventional method of manufacturing the LDD MOS transistor having the pocket region.

As shown in FIG. 1A, through the general process, a gate insulating film 12 and a gate 13 are sequentially formed on a silicon substrate 11.

As shown in FIG. 1B, using gate 13 as mask, an $n^-$ type impurity and a $p^-$ type impurity are sequentially ion-implanted in the substrate. Then, heat treatment is performed to activate the ion-implanted impurity, thereby forming low concentration $n^-$ type source/drain regions 14 and 15 having the double shallow junction and $p^-$ type pocket regions 16, respectively. At this time, low concentration $n^-$ type source/drain regions 14 and 15 having the double shallow junction are formed on both sides of the gate in the substrate, respectively. Further, $p^-$ type pocket regions 16 are formed so as to surround $n^-$ type source/drain regions 14 and 15, respectively.

As shown in FIG. 1C, a chemical vapor deposition (CVD) oxide film is deposited on the entire surface of the substrate. The oxide film is etched through the reactive ion etching (RIE) method, thereby forming sidewall spacers 17 on both sides of gate 13.

As shown in FIG. 1D, using sidewall spacers 17 and gate 13 as masks, an $n^+$ type impurity is ion-implanted in the substrate. Then, heat treatment is performed to activate the ion-implanted impurity, thereby forming $n^+$ type source/drain regions 18 and 19 of high concentration. As a result, the LDD MOS transistor having the pocket region is obtained.

According to the conventional method of manufacturing a MOS transistor, the general ion-implantation process or the tilt ion-implantation process is performed to form the source/drain regions and pocket region. However, if the above ion-implantation process is performed, the defect is generated in the channel region or junction of the silicon substrate. The defect serves as the leakage source of the junction, thereby deteriorating the device characteristics.

SUMMARY OF THE INVENTION

In order to solve the aforementioned problems, it is an object of the present invention to provide a method of manufacturing a MOS transistor which enables to prevent the defect generation in a substrate due to the ion-implantation by forming a double shallow junction, using an insulating film containing impurities whose diffusivity are different from each other, as a diffusion source.

To accomplish the above object, there is provided a method of manufacturing a lightly MOS transistor comprising the steps of forming a gate and a gate insulating film on a semiconductor substrate of a first conductivity type, sequentially; forming, on the sidewalls and top of the gate, on side edges of the gate insulating layer, and on the substrate, an insulating film including two kinds of impurities whose diffusivity and conductivity type are different from each other; forming a cap insulating film on the insulating film; performing the heat treatment process thereby to form impurity regions of a second conductivity type and impurity regions of the first conductivity type surrounding the impurity regions of the second conductivity type, on both sides of the gate in the substrate; etching the insulating film and the cap insulating film thereby to form sidewall spacers on both sides of the gate; and ion-implanting an impurity of the second conductivity type in the substrate thereby to form impurity regions of the second conductivity type adjacent to the impurity regions.

BRIEF DESCRIPTION OF THE DRAWINGS

FIGS. 3A and 3B are diagrams showing the doping profile of BAsSG film.

DETAILED DESCRIPTION OF THE INVENTION

Hereinafter, the preferred embodiment of the present invention will be described with reference to the attached drawings.

FIGS. 2A to 2F are cross-sectional views for showing a method of manufacturing a MOS transistor having the pocket structure, according to an embodiment of the present invention.

Figure 1A:
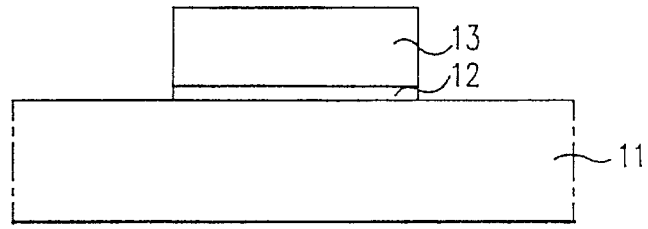
FIGS. 1A to 1D are cross-sectional views for showing a conventional method of manufacturing a MOS transistor.
Figure 1B:
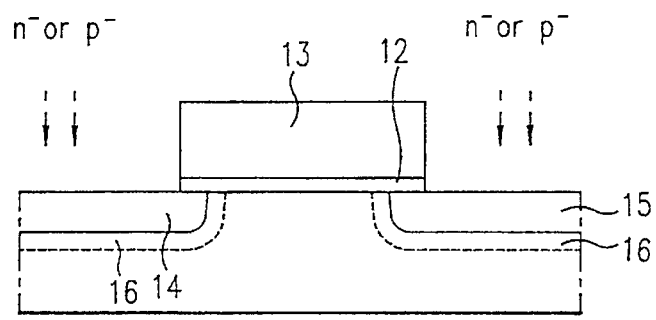
Figure 1C:
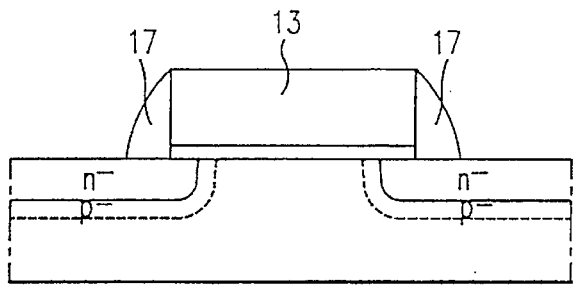
Figure 1D:
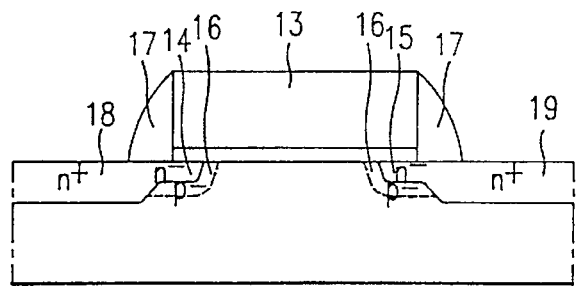
Figure 2A:
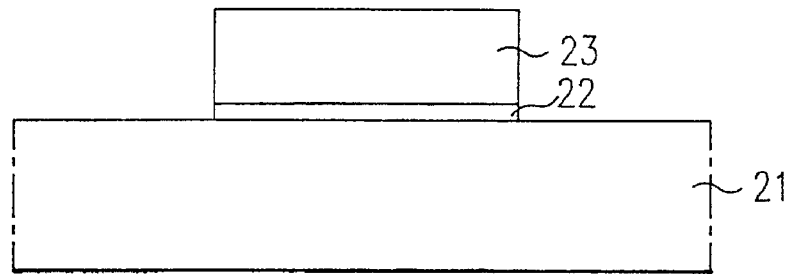
FIGS. 2A to 2F are cross-sectional views for showing a method of manufacturing a MOS transistor according to an embodiment of the present invention.

As shown in FIG. 2A, a gate insulating film 22 and a gate 23 are sequentially formed on a silicon substrate 21.

Figure 2B:
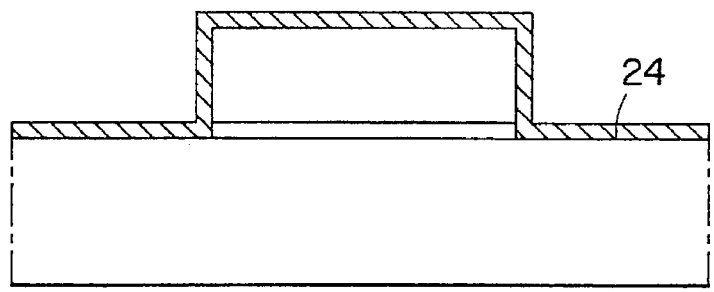

As shown in FIG. 2B, on the entire surface of the substrate including gate 23, an insulating film 24 containing impurities whose diffusivity are different from each other is deposited to a thickness of 100–1000 Å.

Figure 2C:
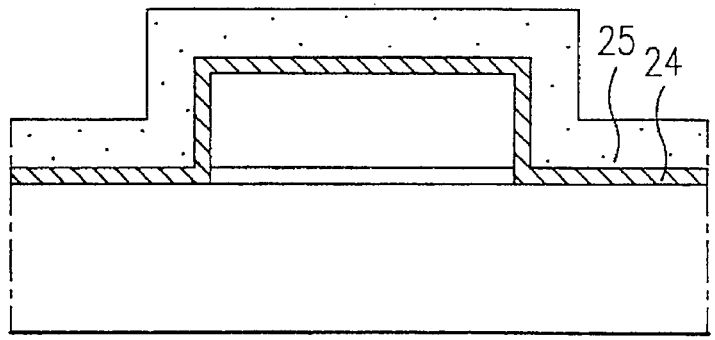

As shown in FIG. 2C, as a cap insulating film 25, a CVD oxide film is deposited to a thickness of 1000 Å on insulating film 24 containing the impurities.

Here, BAsSG film is used as insulating film 24 containing the impurities whose diffusivity are different from each other. BAsSG film 24 is deposited by using a hydride gas like $ASH_4$, $SiH_4$ and $B_2H_6$ or a organometallic source like As—$(OR)_4$, Si—$(OR)_4$, and B—$(OR)_4$. Here, R represents the alcohol group, i.e., the hydrocarbon group (CHx).

Figure 2D:
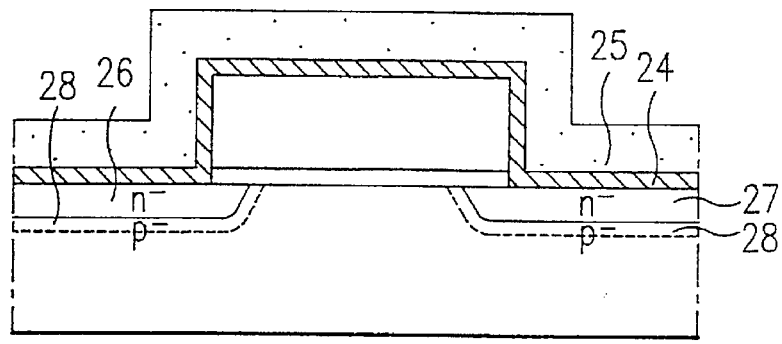

Then, the heat treatment is performed at a temperature of 900° C. for 10–30 min, thereby forming $n^-/p^-$ shallow junctions on both sides of the gate in the substrate, as shown in FIG. 2D. Here, among the double shallow junctions, $n^-$ regions 26 and 27 serves as the source/drain regions, while $p^-$ type regions 28 serve as the pocket regions surrounding $n^-$ type source/drain regions 26 and 27.

BAsSG film 24 is an oxide film containing arsenic (As) and boron (B) whose diffusivity are different from each other in the substrate. The diffusivity of B is ten times of the diffusivity of As in the substrate. Further, the segregation coefficient of B is low. Therefore, if the heat treatment is performed on BAsSG film 24, since the diffusivity of B is larger than that of As, the $n^+/p^-$ double shallow junctions are formed in the substrate, as described above.

FIG. 3 shows the doping profile of BAsSG film. FIG. 3A shows the doping profile before performing the heat treatment, and FIG. 3B shows the doping profile after performing the heat treatment.

In FIG. 3A, the concentrations of As and B contained in the BAsSG film are $5 \times 10^{21}$ atom/cm$^3$, respectively. That is, the same concentrations are used. The concentration of the substrate is $1.8 \times 10^{15}$ atom/cm$^3$.

FIG. 3B shows that the n$^-$/p$^-$ double shallow junctions are formed in the substrate if the heat treatment is performed after depositing the BAsSG film on the substrate. That is, the doping profile of B is changed as the heat treatment time is changed, while the doping profile of As is almost not changed, being independent of the heat treatment time.

In FIG. 3B, (1) shows the doping profile of boron (B) when the heat treatment is performed at a temperature of 900° C. for 30 min, (2) shows the doping profile of boron when the heat treatment is performed at a temperature of 900° C. for 20 min, and (3) shows the doping profile of boron when the heat treatment is performed at a temperature of 900° C. for 10 min, respectively.

If the concentration of boron contained in the BAsSG film is decreased, the concentration and profile of B can be maintained low in the silicon substrate. In addition, to control the concentration profile of the n$^-$/p$^-$ double shallow junctions is easy by controlling the concentration and diffusion time of As and B.

Figure 2E:
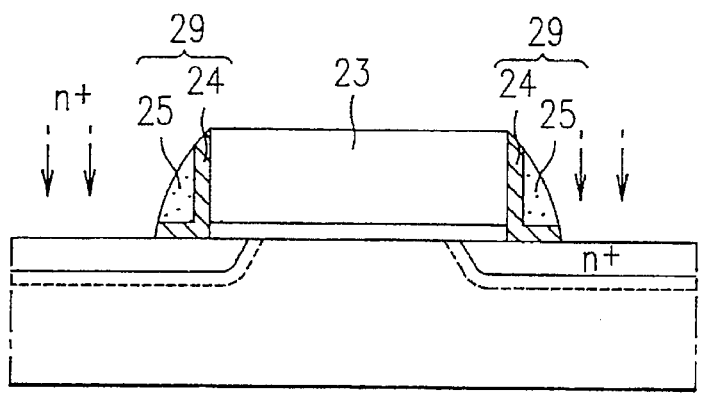
Figure 2F:
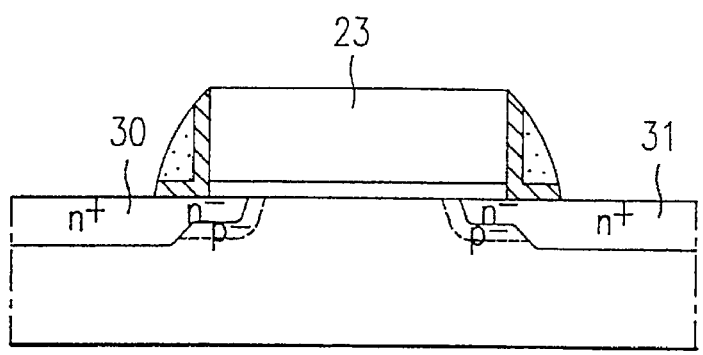

After performing the heat treatment as shown in FIG. 2E, CVD oxide film 25 and BAsSG film 24 are etched anisotropically, thereby forming sidewall spacers 29 consisting of CVD oxide film 25 and BAsSG film 24, on both sides of the gate. After forming the sidewall spacers, using gate 23 and sidewall spacers 29 as masks, an As ion is implanted at a dose of $5 \times 10^{15}$ atom/cm$^3$ and an energy of 40 keV in the substrate. Then, the heat treatment is performed at a temperature of 850° C. for 30 min, thereby forming n$^+$ type source/drain regions 30 and 31 of high concentration. As a result, the transistor having the pocket structure is obtained. 5 In the above embodiment, the n$^-$/p$^-$ double shallow junctions are formed by using the oxide film containing As and B. Alternatively, the n$^-$/n$^-$ double shallow junctions are formed by using the oxide film containing Ga (or In) and P.

According to the present invention as described above, the double shallow junction is formed by using the oxide film containing the impurities as the diffusion source, without performing the ion-implantation process. Thus, the defect generation in the silicon substrate by the ion-implantation process is excluded, thereby preventing the deterioration of the device characteristics.

Further, without the additional deposition process, the sidewall spacer is formed by using the insulating film 24 and the cap insulating film 25 as the material for the sidewall spacer 29. Thus, the process can be simplified.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of forming a lightly doped drain MOS transistor, the method comprising the steps of:

forming a gate insulating layer on a portion of a semiconductor substrate;

forming a gate on the gate insulating layer, the gate including a top and sidewalls:

forming a first insulating layer on the gate and the substrate, the first insulating layer including a P-type and an N-type impurity, the P-type impurity having a first diffusivity, and the N-type impurity having a second diffusivity different than the first diffusivity;

forming a cap insulating layer on the first insulating layer such that the cap insulating layer does not touch the sidewalls of the gate;

heat treating to form first and second impurity in the substrate by diffusion of the P-type and N-type impurities into the substrate on both sides of the gate, the second impurity regions being of the N-type conductivity, and the first impurity regions surrounding the second impurity region and being of the P-type conductivity;

forming, from at least the first insulating layer, a sidewall-spacer mask for said sidewalls of the gate; and forming a third impurity region in the substrate on each side of the gate adjacent to the first and second impurity regions, the third impurity regions being of the N-type conductivity.

2. A method of manufacturing the MOS transistor as claimed in claim 1, wherein:

the first insulating layer is an oxide film.

3. A method of manufacturing the MOS transistor as claimed in claim 2, wherein:

said first insulating layer is a BAsSG film.

4. A method of manufacturing the MOS transistor as claimed in claim 3, wherein:

said BAsSG film is formed by using a hydride gas including AsH$_4$, SiH$_4$ and B$_2$H$_6$ or by using an organometallic source including As—(OR)$_4$, Si—(OR)$_4$, and B—(R)$_4$, where R represents an alcohol group.

5. A method of manufacturing a MOS transistor as claimed in claim 1, wherein:

the thickness of said first insulating layer is 100–10000 Å.

6. A method as in claim 1, wherein the step of forming the third impurity region includes:

ion implanting an N-type impurity into the substrate on said each side of the gate.

7. A method as in claim 6, wherein the step of forming the third impurity region includes:

heat treating in a manner different than said step of heat treating to form first and second impurity regions.

8. A method as in claim 1, wherein the step of forming the sidewall-spacer mask includes:

forming each sidewall-spacer mask also from the cap insulating layer.

9. A method as in claim 1, wherein the step of forming the sidewall-spacer mask includes:

etching the cap insulating layer and the first insulating layer.

10. A method as in claim 1, wherein the step of forming the first insulating layer includes:

causing each first impurity region to be p$^-$; and causing each second impurity region to be n$^-$; and wherein the step of forming a third impurity regions includes:

causing each third impurity region to be n$^+$.

11. A method as in claim 1, wherein the step of forming the cap insulating layer includes:

chemical vapor depositing the cap insulating layer.

12. A method as in claim 1, wherein the step of forming the cap insulating layer includes:

causing the cap insulating layer to be substantially 1000 Å thick.

13. A method as in claim 1, wherein the step of forming the first insulating layer includes:

using, as the first impurity, a material having a diffusivity that is a factor of ten different than the diffusivity of the second impurity.

14. A method as in claim 1, wherein the step of forming the first insulating layer includes:

using a P-type impurity having a lower segregation coefficient than the N-type impurity.

15. A method as in claim 1, wherein the step of forming the first insulating layer includes:

using the same concentration of the first impurity as the second impurity.

16. A method as in claim 1, wherein the step of forming the first insulating layer includes:

using, as the P-type impurity, a substance having a doping profile that is dependent upon a heating duration; and using, as the N-type impurity, a substance having a doping profile that is substantially independent of the heating duration.

17. A method as in claim 1, wherein the step of forming the cap insulating layer includes:

forming the cap insulating layer only on the first insulating layer.

18. A method of forming a lightly doped drain MOS transistor, comprising the steps of:

forming a gate insulating layer on a portion of a semiconductor substrate;

forming a gate on the gate insulating layer, the gate including a top and sidewalls;

forming a first insulating layer on the top and sidewalls of the gate, on side edges of the gate insulating layer, and on the substrate, the first insulating layer including a P-type and an N-type impurity, the P-type impurity having a first diffusivity, and the N-type impurity having a second diffusivity different than the first diffusivity;

heat treating, without previously removing any portions of the first insulating layer, to form a first and second impurity region in the substrate on both sides of the gate via diffusion of the first and second impurities into the substrate, the second impurity region being of the N-type conductivity, and the first impurity regions surrounding a second impurity region and being of the P-type conductivity;

forming a sidewall-spacer mask, from the first insulating layer, for said sidewalls of the gate; and forming a third impurity region in the substrate on each side of the gate adjacent to the first and second impurity regions, the third impurity regions being of the N-type conductivity.

19. A method of forming a lightly doped drain MOS transistor, the method comprising the steps of:

forming a gate insulating layer on a portion of a semiconductor substrate;

forming a gate on the gate insulating layer, the gate including a top and sidewalls;

forming a first insulating layer on the gate and the substrate, the first insulating layer including a P-type and an N-type impurity, the P-type impurity having a first diffusivity, and the N-type impurity having a second diffusivity different than the first diffusivity;

forming a cap insulating layer on the first insulating layer such that the cap insulating layer does not touch the sidewalls of the gate;

heat treating to form a first and second impurity region in the substrate on both sides of the gate via diffusion of the first and second impurities into the substrate, the second impurity regions being of the N-type conductivity, and the first impurity regions surrounding a second impurity region and being of the P-type conductivity;

forming from at least the first insulating layer, a sidewall-spacer mask for each sidewall of the gate; and forming a third impurity region in the substrate on each side of the gate adjacent to the first and second impurity regions using the sidewall-spacer mask, the third impurity regions being of the N-type conductivity.

20. A method of forming a lightly doped drain MOS transistor, comprising the steps of:

forming a gate insulating layer on a portion of a semiconductor substrate;

forming a gate on the gate insulating layer, the gate including a top and sidewalls;

forming a first insulating layer on the top and sidewalls of the gate, on side edges of the gate insulating layer, and on the substrate, the first insulating layer including a P-type and an N-type impurity, the P-type impurity having a first diffusivity, and the P-type impurity having a second diffusivity different than the first diffusivity;

heat treating, without previously removing any portions of the first insulating layer, to form a first and second impurity region in the substrate on both sides of the gate via diffusion of the first and second impurities into the substrate, the second impurity regions being of the N-type conductivity, and the first impurity regions surrounding a second impurity region and being of the P-type conductivity;

forming a sidewall-spacer mask, from the first insulating layer, for each sidewall of the gate; and forming a third impurity region in the substrate on each side of the gate adjacent to the first and second impurity regions, the third impurity regions being of the N-type conductivity.

* * * * *